United States Patent
Kuo et al.

[11] Patent Number: 6,011,402
[45] Date of Patent: Jan. 4, 2000

[54] ELECTRO-OPTIC APPARATUS AND METHOD FOR MEASURING ELECTRIC-FIELD VECTOR

[75] Inventors: Wen-kai Kuo, Hsinchu; Sheng-Lung Huang, Kaohsiung; Liang-Chih Chang; Ping-Chung Chung, both of Hsinchu; Hsiao-Yu Chou; Wen-Fa Chen, both of Hsinchu, all of Taiwan

[73] Assignee: National Science Council, Taipei, Taiwan

[21] Appl. No.: 09/040,819

[22] Filed: Mar. 18, 1998

[51] Int. Cl.[7] ............................................. G01R 31/00
[52] U.S. Cl. .................................. 324/753; 324/752
[58] Field of Search ........................ 324/96, 750–753; 359/246, 248, 250; 356/364, 400

[56] References Cited

U.S. PATENT DOCUMENTS 5,113,131  5/1992  Cooper et al. ............................ 324/96
5,546,011  8/1996  Takahashi et al. ...................... 324/753
5,883,518  3/1999  Borden .................................... 324/752

OTHER PUBLICATIONS

Takahashi et al., "Sampling and Real–Time Methods in Electro–Optic Probing System", IEEE Transactions on Instrumentation and Measurement 44:965–971, Oct. 1995.

*Primary Examiner*—Josie Ballato
*Assistant Examiner*—Minh Tang
*Attorney, Agent, or Firm*—Fish & Richardson P.C.

[57] ABSTRACT

Two-dimensional electric-filed vector is measured in this invention, wherein two linearly polarized laser beams are focused on two different bottom planes of an electro-optic crystal so that two reflected beams from the bottom planes have two different paths inside the electro-optic crystal and thus have different phase retardation when an electric-field is exerted on the electro-optic crystal by a circuit under test. The electric-filed direction of the circuit can be calculated by using two differential signals which are proportional to the phase retardation of the two reflected beams.

7 Claims, 2 Drawing Sheets

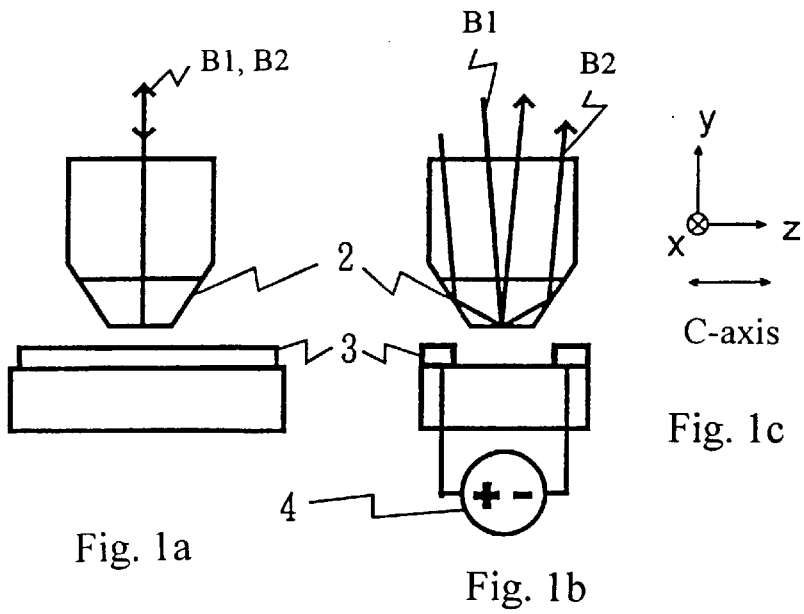
Fig. 1a
Fig. 1b
Fig. 1c
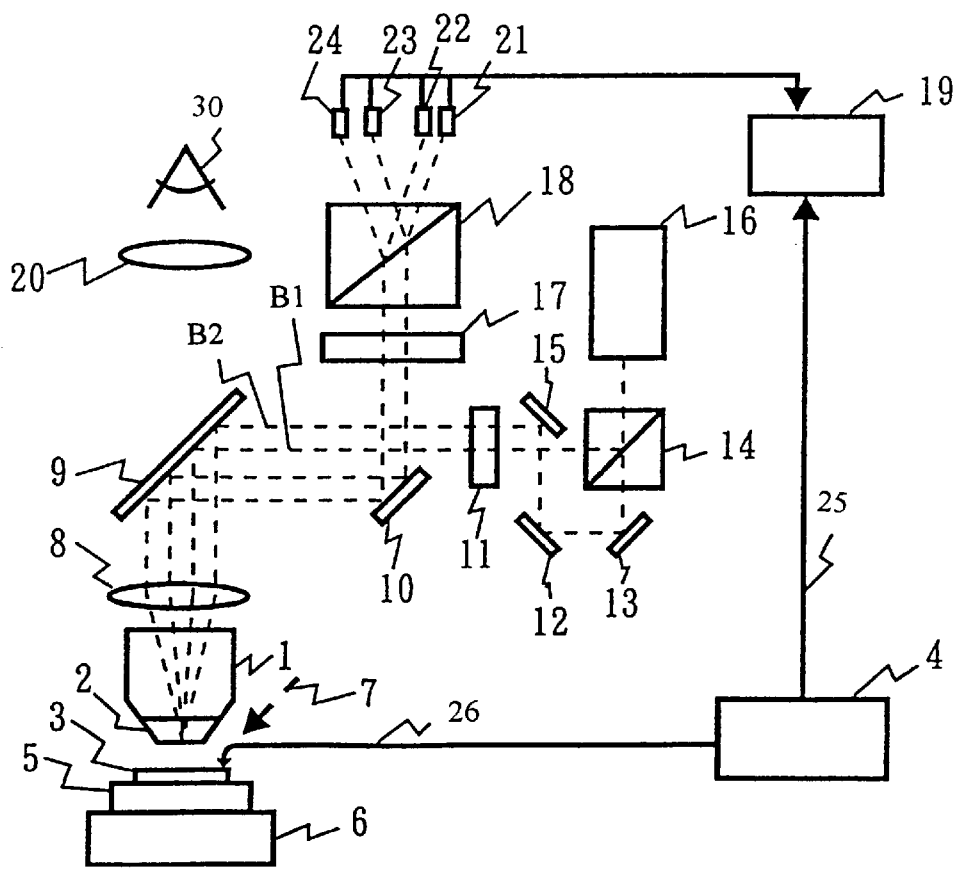
Fig. 2

ELECTRO-OPTIC APPARATUS AND METHOD FOR MEASURING ELECTRIC-FIELD VECTOR

FIELD OF THE INVENTION

The present invention is related to 2-dimensional electric-field vector measurement, and in particular to an electro-optic technique for measuring a 2-dimensional electric-field vector.

BACKGROUND OF THE INVENTION

Wafer-level optoelectronic probing technique on semiconductor devices and circuits have proved to be effective to extract the device/circuit parameters, such as response time, delay time, scattering parameters, etc. [M. Y. Frankel, S. Guta, J. A. Valdmanis, J. F. Whitaker, G. A. Mourou, IEEE Tran. on Microwave Theory & Tech., 39 (1991) 910.; S. L. Huang, C. H. Lee, H-L. A. Hung, IEEE Tran. on Microwave Theory & Tech., 43 (1995) 1281]. Among these techniques, the electro-optic (EO) probing is a very useful approach to measure the electric-field (E-field) in microwave circuits [K. W. Chang, W. V. Sorin, OSA Proc. On Ultrafast Electronics and Opto-electronics, 14 (1993) 220; M. G. Li, E. A. Chauchard, C. H. Lee, Picosecond Electronics and Optoelectronics, Spring-Verlag, (1986) 54]. For these measurements, only field strength is needed to obtain the required information. However, in some circumstance, such as the chamfered bending of a transmission line, patch array antenna, active region of devices, the field direction may also be important to be determined [T. Koryu Ishii, Microwave Engineering, 2nd ed., 1989]. Traditionally, antenna is used for the measurements of E-field, which essentially is far-field measurement, and will not satisfy the future needs of microwave circuit technology development. On the other hand, in most EO sampling techniques [M. Shinagawa, T. Nagatsuma, IEEE Tran. Instrum. Meas., 41 (1992) 375; H. Takahashi, S-I. Aoshima, Y. Tsuchiya, IEEE Tran. Instrum. Meas., 44 (1995) 956], only one laser beam is used to probe the E-field signal, that will make the sensitivity of the system be decreased due to the EO crystal is not in the direction of best interaction with E-field. In the worse case, take $LiTaO_3$ crystal for example, if its c-axis is perpendicular to E-field direction and a probing beam propagates in y direction only (that is a common case if the crystal is y-cut and with a reflection coating on the bottom), it will not be able to sense any E-field signal. In this invention, a novel E-field direction measurement with high sensitivity is demonstrated. This technique can be also used to compensate the angle between the E-field and the best interacted direction of the EO crystal.

SUMMARY OF THE INVENTION

The present invention discloses an electro-optic apparatus for measuring an electric-filed direction of a circuit comprising an electro-optic crystal adapted to be disposed above said circuit;

a splitter means for dividing a laser beam into two parallel beams with equal intensity;

a polarizer for linearly polarizing said two beams;

a dichroic beam splitter for reflecting the two linearly polarized beams to an objective lens, which can let an illuminator beam reflected from said circuit pass through;

said objective lens focusing the two linearly polarized beams from said dichroic beam splitter on two different bottom planes of said electro-optic crystal so that two reflected beams from said bottom planes have two different paths inside the electro-optic crystal;

a compensator for biasing the two reflected beams from said bottom planes of said electro-optic crystal;

an analyzer for splitting each of the two biased beams from said compensator into an ordinary and extraordinary rays, wherein differences between refractive indices of the ordinary and extraordinary rays of the two biased beams are substantially zero when no electric-field exerted on the electro-optic crystal;

a first pair of detectors for transforming variation of light intensity between the ordinary and extraordinary rays of one of the two biased beams to a first differential signal; and a second pair of detectors for transforming variation of light intensity between the ordinary and extraordinary rays of another one of the two biased beams to a second differential signal;

wherein the first and second differential signals are proportional to phase retardation of the two reflected beams from said bottom planes of said electro-optic crystal induced by an electric-field of said circuit on the electro-optic crystal.

Preferably, the electro-optic apparatus of the present invention further comprises another compensator, wherein said compensator and said another compensator separately bias the two reflected beams from said bottom planes of said electro-optic crystal, and differences between refractive indices of the ordinary and extraordinary rays of the two biased beams are substantially zero when no electric-field exerted on the electro-optic crystal.

Preferably, the electro-optic apparatus of the present invention further comprises a viewing lens which is disposed near to the objective lens so that the viewing lens and objective lens together form a microscope for observing the circuit and foci of the two linearly polarized beams from said dichroic beam splitter on th two different bottom planes of said electro-optic crystal.

Preferably, the electro-optic apparatus of the present invention further comprises an amplifier for amplifying the first and second differential signals and outputting amplified signals to an observing apparatus or a processing circuit.

Preferably, the electro-optic apparatus of the present invention further comprises an XYZ stage for supporting the circuit and adjusting the position of the device relative to the electro-optic crystal.

Preferably, the splitter means for use in the electro-optic apparatus of the present invention comprises a beam splitter for splitting a laser beam into two beams with equal intensity and three bending mirrors for reflecting one of the two split beams three times to parallel with another one of the two split beams.

The present invention also discloses a method for measuring an electric-filed direction of a circuit comprising the following the steps:

placing an electro-optic crystal above an circuit;

forming two parallel laser beams with equal intensity;

linearly polarizing the two parallel laser beams;

focusing the two linearly polarized laser beams on two different bottom planes of said electro-optic crystal so that two reflected beams from said bottom planes have two different paths inside the electro-optic crystal and thus have different phase retardation when an electric-field is exerted on said electro-optic crystal by said circuit;

biasing the two reflected beams from said bottom planes of said electro-optic crystal;

splitting each of tie two biased beams into an ordinary and extraordinary rays, wherein differences between refractive indices of the ordinary and extraordinary rays of the two biased beams are substantially zero when no electric-field exerted on the electro-optic crystal;

transforming variation of light intensity between the ordinary and extraordinary rays of one of the two biased beams to a first differential signal;

transforming variation of light intensity between the ordinary and extraordinary rays of another one of the two biased beams to a second differential signal;

calculating the electric-filed direction of the circuit using the first and second differential signals which are proportional to phase retardation of the two reflected beams from said bottom planes of said electro-optic crystal induced by the electric-field of said circuit on said electro-optic crystal.

Two-dimensional (2-D) electric-field (E-field) vector measurement is able to be carried out with the electro-optic apparatus and the method of the present invention. Laser beams with different propagation paths in electro-optic (EO) crystal are used to resolve the E-field direction on wafer. In one of the preferred embodiments of the present invention a common lithium tantalate (LiTaO$_3$) crystal with a thickness of 20 $\mu$m and a bottom area of 200 $\mu$m×200 $\mu$m was taken as a typical EO crystal. A sensitivity of 1.8 V/cm·$\sqrt{Hz}$ is achieved easily for the E-field strength measurement. Field direction can be identified with a field strength of greater than 25 V/cm, and the root-mean-square error is 1.1°.

BRIEF DESCRIPTION OF THE DRAWINGS

FIG. 1a and 1b are schematic side and front views showing geometric shape of an electro-optic crystal with the laser beams used in the present invention, respectively.

FIG. 1c shows the relationship between c-axis of the electro-optic crystal and the x-y-z coordinates corresponding to FIG. 1b.

FIG. 2 is a schematic view showing a typical experiment set-up of electric-field vector sensing system used in the present invention.

DETAILED DESCRIPTION OF THE INVENTION

Figure 3:
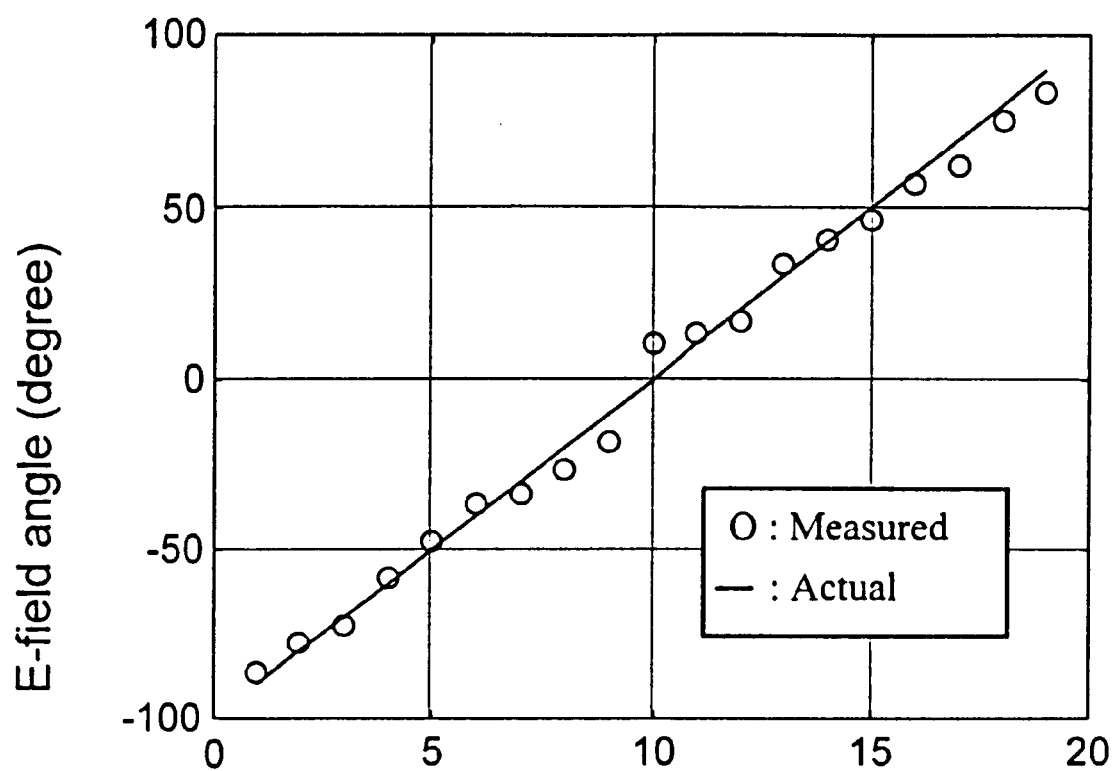
FIG. 3 is a plot showing comparisons between the actual and measured E-field directions by using the system shown in FIG. 2 according to the present invention, wherein the solid line represents the actual E-field angles and the blank circles represent the 19 measurement values.

To measure the electric-field direction, two laser beams with different propagation directions are used to interact with E-field via an electro-optic crystal. The geometric shape of the electro-optic crystal 2 with the laser beams B1 and B2 are depicted in FIGS. 1a and 1b, and the principle axes of the electro-optic crystal 2 are indicated in FIG. 1c. With electric-field applied on the crystal 2 from a device under test 3 and a function generator 4, the laser beams encounters an extra phase retardation due to the index ellipsoid deformation [A. Yariv, Optical Electronics, 3rd ed., 1985]. For beam B1, it propagates in y direction of the crystal only, then the new refractive indices for ordinary and extraordinary rays are equal to the half length of the long and short axes of the following ellipse, $$a_1 x^2 + a_3 z^2 + 2a_5 zx = 1 \quad (1)$$

wherein $a_1$, $a_3$ and $a_5$ are coefficients, and z and x are coordinates shown in FIG. 1c.

The relationship between the coefficients, $a_1$, $a_3$ and $a_5$, and the electric-field, $\overline{E} = E_x a_{x+Ey} a_y + E_z a_2$, is as follows:

$$\begin{bmatrix} a_1 - 1/n_o^2 \\ a_3 - 1/n_e^2 \\ a_5 \end{bmatrix} = \begin{bmatrix} r_{11} & r_{12} & r_{13} \\ r_{31} & r_{32} & r_{33} \\ r_{51} & r_{52} & r_{53} \end{bmatrix} \begin{bmatrix} E_x \\ E_y \\ E_z \end{bmatrix}$$

wherein:

$a_1$, $a_3$ and $a_5$ are same as above; [$r_{ij}$] is the electro-opti tensor of the crystal 2; $n_e$; $n_o$ are refractive indices of the ordinary and extraordinary rays when the crystal 2 is not subjected to an electric-field, respectively; $E_x$, $E_y$ and $E_z$ are unit vectors of the electric-filed in x-axis, y-axis and z-axis, respectively.

Taking LiTaO$_3$ crystal as an example of the electro-optic crystal 2, if the y component of a applied electric-field is equal to zero, it can be shown that the extra phase retardation of x-polarization $\phi_1$ with respect to z-polarization is almost proportional to the z component of the applied E-field, $$\phi_1 = k_1 E = k_1 E \cos \theta \quad (2)$$

wherein E is the electric-field strength, $\theta$ is the angle between the electric-field and the c-axis of the crystal 2, and $k_1$ is a constant.

For laser beam B2, it propagates in parallel to y-z plane of the crystal 2; therefore, in addition to the retardation as Eq. (2), the y-polarization of the laser beam also undertakes an extra retardation. Consider a laser beam incident on the electro-optic crystal 2 in the z direction thereof, the refractive indices for ordinary and extraordinary rays are equal to the half length of the long and short axes of the following ellipse, $$a_1 x^2 + a_2 y^2 + 2a_6 xy = 1 \quad (3)$$

wherein $a_1$, $a_2$ and $a_6$ are coefficients, x and y are coordinates shown in FIG. 1c.

The coefficients, $a_1$, $a_2$ and $a_6$, and the electric-field have the following relationship:

$$\begin{bmatrix} a_1 - 1/n_o^2 \\ a_2 - 1/n_e^2 \\ a_6 \end{bmatrix} = \begin{bmatrix} r_{11} & r_{12} & r_{13} \\ r_{21} & r_{22} & r_{23} \\ r_{61} & r_{62} & r_{63} \end{bmatrix} \begin{bmatrix} E_x \\ E_y \\ E_z \end{bmatrix}$$

wherein:

$a_1$, $a_2$, $a_6$, [$r_{ij}$], $n_e$, $n_o$, $E_x$, and $E_y$ and $_{Ez}$ are defined as above.

For the LiTaO$_3$ crystal, it can be shown that the extra phase retardation of y-polarization with respect to z-polarization is almost proportional to the x component of the applied E-field. Using the superposition principle, the total extra retardation $\phi_2$ for laser beam B2 is, $$\phi_2 = k_{21} E_x + k_{22} E_z = E (k_{21} \sin \theta k_{22} \cos \theta) \quad (4)$$

wherein $E_x$, $E_z$, E and $\theta$ are defined as above, and $k_{21}$ and $k_{22}$ are constants.

All the constants $k_1$, $k_{21}$ and $k_{22}$ in Eqs. (2) and (4) can be calibrated by considering the difference in interaction length between the laser beam and E-field for beams B1 and B2. Thereby, from Eqs. (2) and (4), the electric-field direction $\theta$ is obtained, $$\theta = \tan^{-1}\left[\frac{\phi_2 \cdot k_1 / \phi_1 - k_{22}}{k_{21}}\right] \quad (5)$$

The 2-dimensional electric-field, $\overline{E}_z$, can now be determined by knowing the angle θ between the electric-field and the c-axis of the crystal 2 from Eq. (5), and the electric-field strength, E, from Eq. (2) or (4). For other electro-optical crystals, the above analysis principles are also applicable.

The experiment system set-up for sensing electric-field vector using $LiTaO_3$ electro-optic crystal is shown in FIG. 2. A polarizer 11 and an analyzer 18 were used to detect the phase retardation. To improve the measurement sensitivity, a compensator 17 and a differential lock-in amplifier 19 were employed. The $LiTaO_3$ electro-optic (EO) crystal 2 was supported by a glass 1 for the convenience of mounting on a cantilever beam. The thickness of $LiTaO_3$ is about 20 μm and bottom area is about 200 μm×200 μm.

A He-Ne laser beam from a He-Ne laser 16 was divided by a beam splitter 14 into two beams with equal intensity, one of which B2 was bent three times by three bending mirrors 13, 12 and 15, to be parallel to the other B1. Both of the beams B1 and B2 passed the same polarizer 11 to become 45° linear polarization to z-axis, and were bent by a dichroic beam splitter 9 which can let an illuminator beam 7 reflected from a device 3 under test pass through. Then these two beams B1 and B2 were focused by an objective lens 8 with different paths inside the EO crystal 2 as shown in FIG. 1b, and the resulting spots focused on the EO crystal 2 planes were in the level of 10 μm. In order to separate incident and reflected light, the beam B1 was not exactly perpendicular to the bottom plane of EOP but a little slanting from the normal direction. It would lead beam B1 to have a small z component, but which was neoligible compared with the y component. After reflection form the bottom planes of EO crystal 2, these two beams were reflected by the dichroic beam splitter 9, picked off by a pick-off polarizer 10 and fed into the compensator 17. The compensator 17 adjusted the optical bias points for both beams so that the analyzer 18 and two pairs of detectors 21, 22, and 23, 24 have a high detection sensitivity to the variations of polarization of the two beams. For the best detection of each beam, individual compensator for each beam was needed because different optical bias offset was introduced to each propagation path. For simplicity, only one compensator was used in the experiment system. The analyzer 18 is a polarization splitter for transforming a variation of polarization due to the phase retardation to a variation of light intensity, wherein each of the two beams is splitter into an ordinary and extraordinary rays. Each pair (21, 22, or 23, 24) of the two pairs of detectors have a function of transforming the variation of light intensity to a differential signal. The differential signals generated from the two pairs of detectors 21, 22, and 23, 24, which are proportional to the $\phi_1$ and $\phi_2$ of Eqs. (2) and (4), were amplified by the differential lock-in amplifier 19 so that the variation between the two differential signal can be observed. The laser beam position and focus on the EO crystal 2 were monitored by a viewing lens 20. The test electric-field was generated by a function generator 4 which provided both chopped DC signal 26 for the device 3 and reference signal 25 for the lock-in amplifier 19. The device 3 was mounted on a rotation stage 5 which in turn was disposed on a movable XYZ stage 6, so that the electric-field direction can be changed by the rotation stage 5, and the position of the device 3 can be adjusted by the movable XYZ stage 6.

FIG. 3 shows 19 runs of the measured values and the actual values of the angles between the electric-filed and c-axis of the EO crystal 2 conducted by using the system shown in FIG. 2. The actual values of the angles were from −90° to 90° with an increment of 10° at one time. The data in FIG. 3 indicate that the electric-field direction can be identified accurately with a root-mean-square error of 1.1°.

Although the present invention utilizing two laser beams having different electric-field induced optical path variations in electro-optic crystal to measure 2-dimensional electric-filed vector have been described, those skilled in the art should understand that they can make various changes, substitutions and alternations herein without departing from the spirit and scope of the invention in its broadest form.

What is claimed is:

1. An electro-optic apparatus for measuring an electric-filed direction of a circuit comprising:

an electro-optic crystal adapted to be disposed above said circuit;

a splitter means for dividing a laser beam into two parallel beams with equal intensity;

a polarizer for linearly polarizing said two beams;

a dichroic beam splitter for reflecting the two linearly polarized beams to an objective lens, which can let an illuminator beam reflected from said circuit pass through;

said objective lens focusing the two linearly polarized beams from said dichroic beam splitter on two different bottom planes of said electro-optic crystal so that two reflected beams from said bottom planes have two different paths inside the electro-optic crystal;

a compensator for biasing the two reflected beams from said bottom planes of said electro-optic crystal;

an analyzer for splitting each of the two biased beams from said compensator into an ordinary and extraordinary rays, wherein differences between refractive indices of the ordinary and extraordinary rays of the two biased beams are substantially zero when no electric-field exerted on the electro-optic crystal;

a first pair of detectors for transforming variation of light intensity between the ordinary and extraordinary rays of one of the two biased beams to a first differential signal; and a second pair of detectors for transforming variation of light intensity between the ordinary and extraordinary rays of another one of the two biased beams to a second differential signal;

wherein the first and second differential signals are proportional to phase retardation of the two reflected beams from said bottom planes of said electro-optic crystal induced by an electric-field of said circuit oil the electro-optic crystal.

2. The electro-optic apparatus according claim 1 further comprising another compensator, wherein said compensator and said another compensator separately bias the two reflected beams from said bottom planes of said electro-optic crystal, wherein differences between refractive indices of the ordinary and extraordinary rays of the two biased beams are substantially zero when no electric-field exerted on the electro-optic crystal.

3. The electro-optic apparatus according claim 1 further comprising a viewing lens which is disposed near to the objective lens so that the viewing lens and objective lens together form a microscope for observing the circuit and foci of the two linearly polarized beams from said dichroic beam splitter on the two different bottom planes of said electro-optic crystal.

4. The electro-optic apparatus according claim 1 further comprising an amplifier for amplifying the first and second differential signals and outputting amplified signals to an observing apparatus or a processing circuit.

5. The electro-optic apparatus according claim 1 further comprising an XYZ stage for supporting the circuit and adjusting the position of the device relative to the electro-optic crystal.

6. The electro-optic apparatus according claim 1, wherein the splitter means comprises a beam splitter for splitting a laser beam into two beams with equal intensity and three bending mirrors for reflecting one of the two split beams three times to parallel with another one of the two split beams.

7. A method for measuring an electric-filed direction of a circuit comprising the following the steps:

placing an electro-optic crystal above an circuit;

forming two parallel laser beams with equal intensity;

linearly polarizing the two parallel laser beams;

focusing the two linearly polarized laser beams on two different bottom planes of said electro-optic crystal so that two reflected beams from said bottom planes have two different paths inside the electro-optic crystal and thus have different phase retardation when an electric-field is exerted on said electro-optic crystal by said circuit;

biasing the two reflected beams from said bottom planes of said electro-optic crystal;

splitting each of the two biased beams into an ordinary and extraordinary rays, wherein differences between refractive indices of the ordinary and extraordinary rays of the two biased beams are substantially zero when no electric-field exerted on the electro-optic crystal;

transforming variation of light intensity between the ordinary and extraordinary rays of one of the two biased beams to a first differential signal;

transforming variation of light intensity between the ordinary and extraordinary rays of another one of the two biased beams to a second differential signal; and calculating the electric-filed direction of the circuit using the first and second differential signals which are proportional to phase retardation of the two reflected beams from said bottom planes of said electro-optic crystal induced by the electric-field of said circuit on said electro-optic crystal.

* * * * *